United States Patent
Kaneoya et al.

(10) Patent No.: US 9,674,977 B2
(45) Date of Patent: Jun. 6, 2017

(54) ELECTRIC COMPONENT BOX AND INDOOR UNIT OF AIR CONDITIONER

(71) Applicant: Mitsubishi Electric Corporation, Tokyo (JP)

(72) Inventors: Shinya Kaneoya, Tokyo (JP); Masahiko Takagi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 261 days.

(21) Appl. No.: 14/512,543

(22) Filed: Oct. 13, 2014

(65) Prior Publication Data
US 2015/0201519 A1  Jul. 16, 2015

(30) Foreign Application Priority Data
Jan. 15, 2014  (JP) ................. 2014-005369

(51) Int. Cl.
| | | |
|---|---|---|
| *H05K 7/14* | (2006.01) | |
| *F24F 13/20* | (2006.01) | |
| *F24F 1/00* | (2011.01) | |
| *H05K 5/02* | (2006.01) | |

(52) U.S. Cl.
CPC ......... *H05K 7/1427* (2013.01); *F24F 1/0007* (2013.01); *F24F 13/20* (2013.01); *H05K 5/0247* (2013.01); *F24F 2013/207* (2013.01)

(58) Field of Classification Search
CPC  F24F 1/0007; F24F 2013/207; H05K 5/0247; H05K 7/1427
See application file for complete search history.

(56) References Cited

U.S. PATENT DOCUMENTS

| | | | | |
|---|---|---|---|---|
| 5,632,155 | A * | 5/1997 | Sugiyama ............. | F24F 1/0007 62/179 |
| 7,028,500 | B2 * | 4/2006 | Jeon ...................... | F24F 1/0007 62/298 |
| 2011/0113807 | A1 | 5/2011 | Kojima et al. | |

(Continued)

FOREIGN PATENT DOCUMENTS

| | | |
|---|---|---|
| CN | 102062457 A | 5/2011 |
| EP | 2 017 544 A1 | 1/2009 |
| EP | 2 325 572 A2 | 5/2011 |

(Continued)

OTHER PUBLICATIONS

Extended European Search Report dated Jun. 18, 2015 issued in corresponding EP patent application No. 14189468.3.

(Continued)

*Primary Examiner* — Allen Flanigan
*Assistant Examiner* — Filip Zec
(74) *Attorney, Agent, or Firm* — Posz Law Group, PLC

(57) ABSTRACT

An electric component box that accommodates therein an electric component, which includes: a control board that controls an air conditioner indoor unit; a power supply and indoor-outdoor wiring terminal block that is provided on the control board and is connected to a communication wire wired from the air conditioner indoor unit to an air conditioner outdoor unit and is connected to a power wire that supplies power; and a communication-wire terminal block that is provided on the control board and is connected to a communication wire for an external input.

16 Claims, 13 Drawing Sheets

(56) References Cited

U.S. PATENT DOCUMENTS

2015/0009626 A1    1/2015  Lan et al.

FOREIGN PATENT DOCUMENTS

| GB | 2 474 685 A | 4/2011 | |
|---|---|---|---|
| JP | 09-064562 A | 3/1997 | |
| JP | 10-259929 A | 9/1998 | |
| JP | 2000-088281 A | 3/2000 | |
| JP | WO 2010050600 A1 * | 5/2010 | ............ F24F 1/0007 |
| JP | 2010-270978 A | 12/2010 | |
| JP | 2011-106801 A | 6/2011 | |
| WO | 2013/129300 A1 | 9/2013 | |

OTHER PUBLICATIONS

Office Action mailed Jan. 3, 2017 issued in corresponding CN patent application No. 201410646204.2 (and English translation).

* cited by examiner

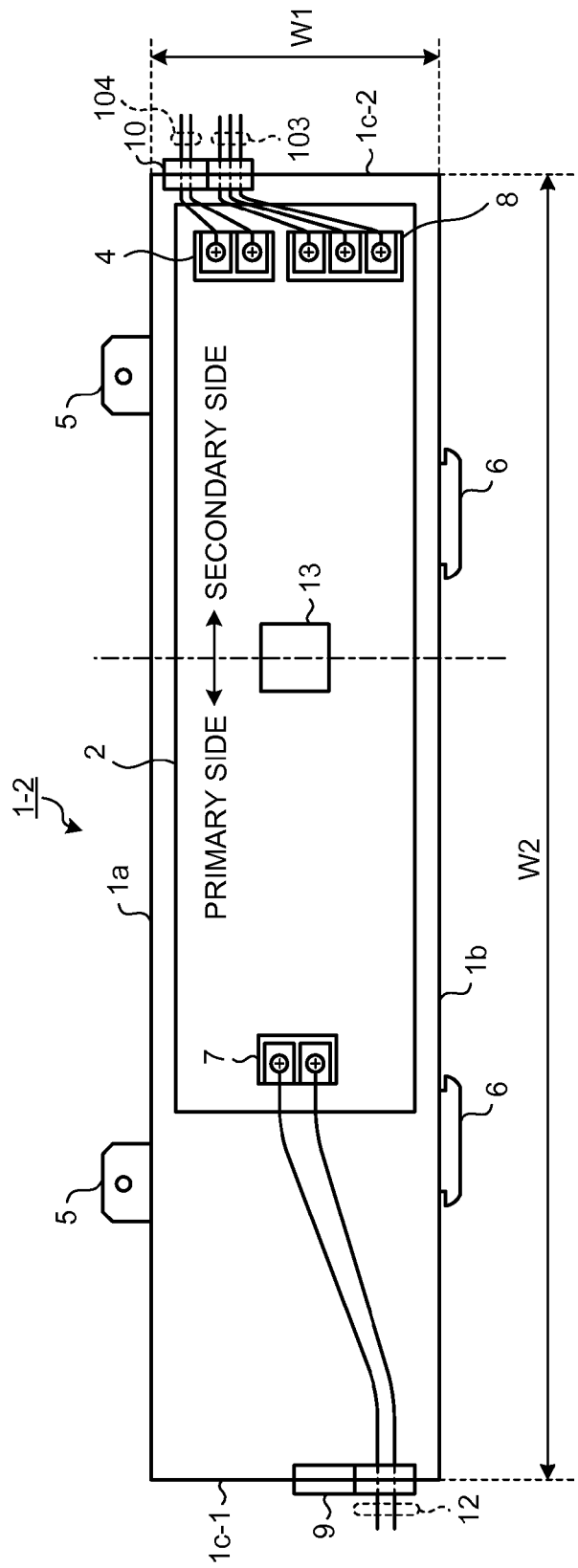

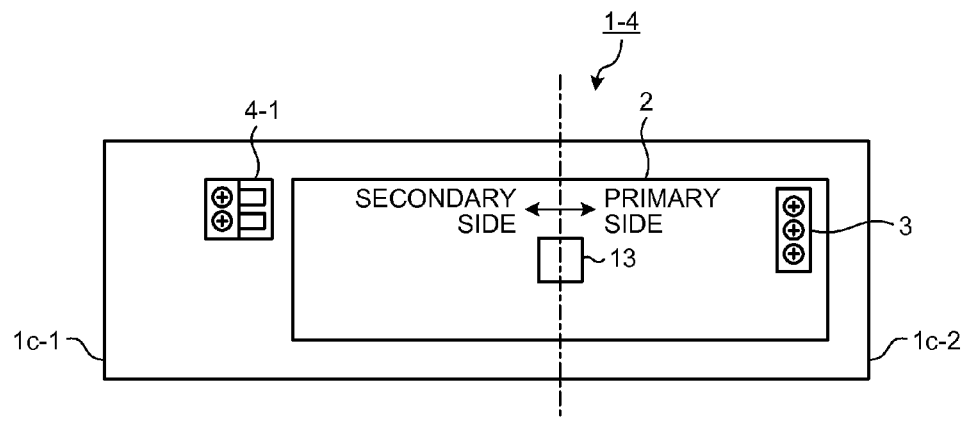
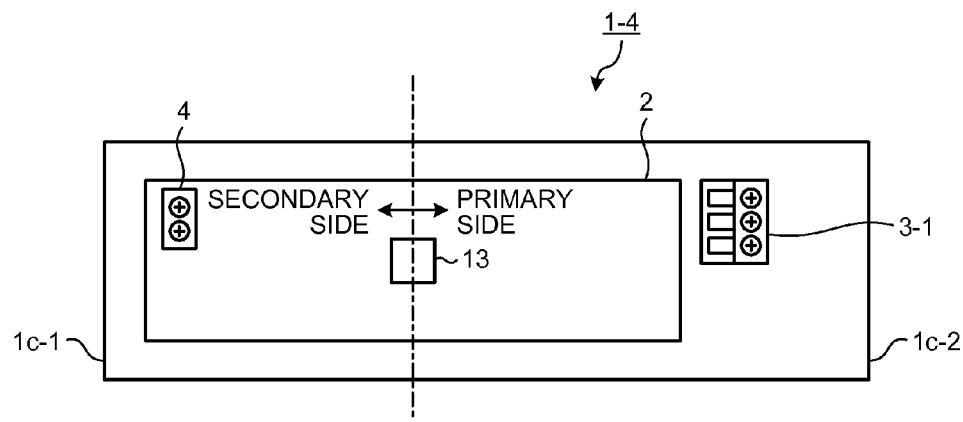
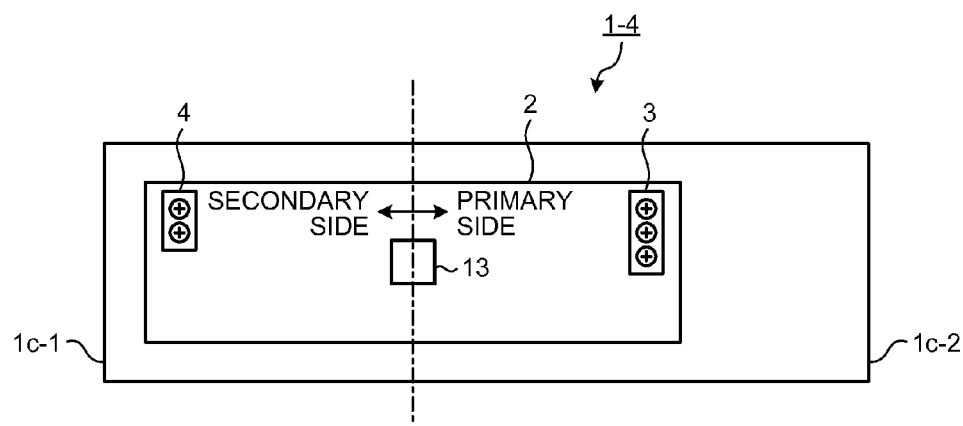

ELECTRIC COMPONENT BOX AND INDOOR UNIT OF AIR CONDITIONER

BACKGROUND OF THE INVENTION

1. Field of the Invention

The present invention relates to an electric component box and an indoor unit of an air conditioner.

2. Description of the Related Art

Indoor units of air conditioners have various forms. For example, the four-directional cassette-type indoor unit illustrated in Japanese Patent Application Laid-open No. 2011-106801 is configured such that an electric motor provided in the casing of the indoor unit is driven to rotate an air blower connected to the shaft of the electric motor, thereby drawing indoor air in through a bell mouth provided in the casing and blowing the air with which heat has been exchanged by a heat exchanger out into the room. In this type of indoor unit, in many cases, an electric component box accommodating therein a control board for controlling the driving of the indoor unit is arranged in a lower part of the indoor unit. In the electric component box, as well as the control board, the following are provided: a terminal block for electrically connecting the indoor unit with an outdoor unit, a terminal block for electrically connecting the outdoor unit with a remote controller, a terminal block for connecting a power wire that supplies power to the indoor unit, and the like.

However, in the conventional technique represented by Japanese Patent Application Laid-open No. 2011-106801, each of the terminal blocks described above is screwed to the casing of the electric component box. Therefore, not only are the material cost and man-hours for assembly associated with wiring the respective terminal blocks screwed to the casing of the electric component box to the control board high, but also a space needs to be made available in the electric component box large enough for the terminal block.

SUMMARY OF THE INVENTION

It is an object of the present invention to at least partially solve the problems in the conventional technology.

According to an aspect of the present invention, an electric component box that accommodates therein an electric component includes: a control board that controls an air conditioner indoor unit; a power supply and indoor-outdoor wiring terminal block that is provided on the control board and is connected to a communication wire wired from the air conditioner indoor unit to an air conditioner outdoor unit and connected to a power wire that supplies power; and a communication-wire terminal block that is connected to a communication wire for an external input.

According to another aspect of the present invention, an electric component box that accommodates therein an electric component includes: a control board that controls an air conditioner indoor unit; a power supply and indoor-outdoor wiring terminal block that is connected to a communication wire wired from the air conditioner indoor unit to an air conditioner outdoor unit and connected to a power wire that supplies power; and a communication-wire terminal block that is provided on the control board and that is connected to a communication wire for an external input.

According to still another aspect of the present invention, an electric component box that accommodates therein an electric component includes: a control board that controls an air conditioner indoor unit; an indoor-outdoor wiring terminal block that is connected to a communication wire wired from the air conditioner indoor unit to an air conditioner outdoor unit; a communication-wire terminal block that is connected to a communication wire for an external input; and a power-wire terminal block that is provided on the control board and that is connected to a power wire that supplies power.

According to still another aspect of the present invention, an electric component box that accommodates therein an electric component includes: a control board that controls an air conditioner indoor unit; an indoor-outdoor wiring terminal block that is provided on the control board and is connected to a communication wire that is wired from the air conditioner indoor unit to an air conditioner outdoor unit; a communication-wire terminal block that is provided on the control board and is connected to a communication wire for an external input; and a power-wire terminal block that is connected to a power wire that supplies power.

According to still another aspect of the present invention, an indoor unit of an air conditioner includes the electric component box described above.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 11 is an explanatory diagram of a modification of the electric component box according to the second embodiment of the present invention;

FIGS. 12A to 12C are interior perspective views of an electric component box according to a third embodiment of the present invention.

DETAILED DESCRIPTION OF THE PREFERRED EMBODIMENTS

Exemplary embodiments of an electric component box and an indoor unit of an air conditioner according to the present invention will be explained in detail below with reference to the accompanying drawings. Note that the present invention is not limited to the embodiments.

First Embodiment

Figure 1:
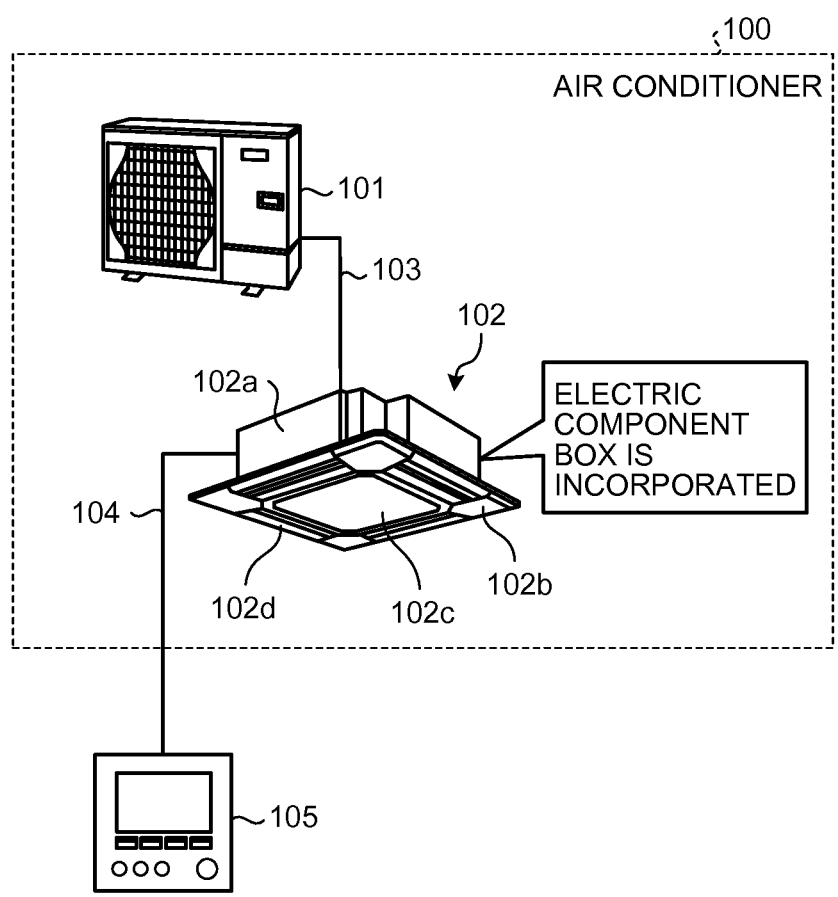
FIG. 1 schematically illustrates an air conditioner according to first and second embodiments of the present invention.

FIG. 1 schematically illustrates an air conditioner 100 according to first and second embodiments of the present invention. The air conditioner 100 includes an indoor unit 102 (for example, a four-directional cassette-type indoor unit) and an outdoor unit 101. A remote controller 105 is connected to the indoor unit 102 via a remote-controller communication wire 104; and the indoor unit 102 is connected to the outdoor unit 101 via an indoor-outdoor communication wire 103. Information is transferred between the remote controller 105 and the indoor unit 102 via the remote-controller communication wire 104.

A decorative panel 102b is attached to a lower surface of a casing 102a of the indoor unit 102. A suction port 102c of indoor air is detachably attached at the center of the decorative panel 102b; and outlet ports 102d are provided around the suction port 102c.

Figure 2:
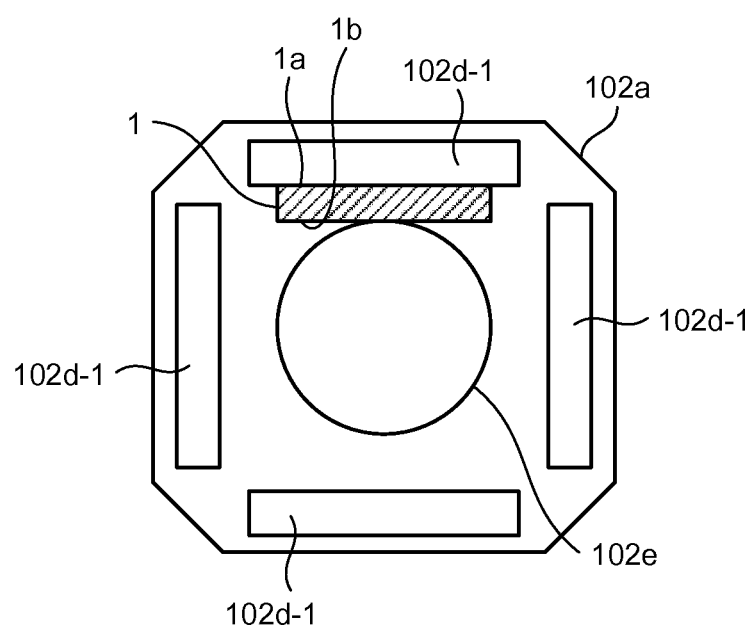
FIG. 2 illustrates a casing of an indoor unit with a the decorative panel illustrated in FIG. 1 being detached and is as viewed from a lower surface side.

FIG. 2 illustrates the casing 102a of the indoor unit 102 with the decorative panel 102b illustrated in FIG. 1 being detached and is as viewed from the lower surface side. As illustrated in FIG. 2, the casing 102a includes a bell mouth 102e provided at a position opposite to the suction port 102c for the decorative panel 102b; a plurality of outlet ports 102d-1 that are provided at positions opposite to the outlet ports 102d in the decorative panel 102b; and an electric component box 1 provided between the outlet port 102d-1 and the bell mouth 102e. The casing 102a is provided with a blower (not illustrated) that draws in indoor air through the bell mouth 102e and blows it out through the outlet ports 102d-1; a heat exchanger (not illustrated) provided around the blower, and the like.

The electric component box 1 is constituted such that one longitudinal side surface (an inner side surface 1b: a surface on the bell mouth 102e side) of the casing is positioned more on an outer diameter side than on an edge of an opening of the bell mouth 102e, and the other of the longitudinal side surfaces (an outer side surface 1a: the outlet port 102d-1 side) is positioned more on a central side than on an edge of the outlet port 102d-1, so as not to block the opening of the bell mouth 102e; and is provided in the casing 102a so that the lower surface thereof opposes the decorative panel 102b. According to this configuration, indoor air having passed through the suction port 102c of the decorative panel 102b is drawn into the bell mouth 102e without being blocked by the inner side surface 1b of the electric component box 1.

Figure 3:
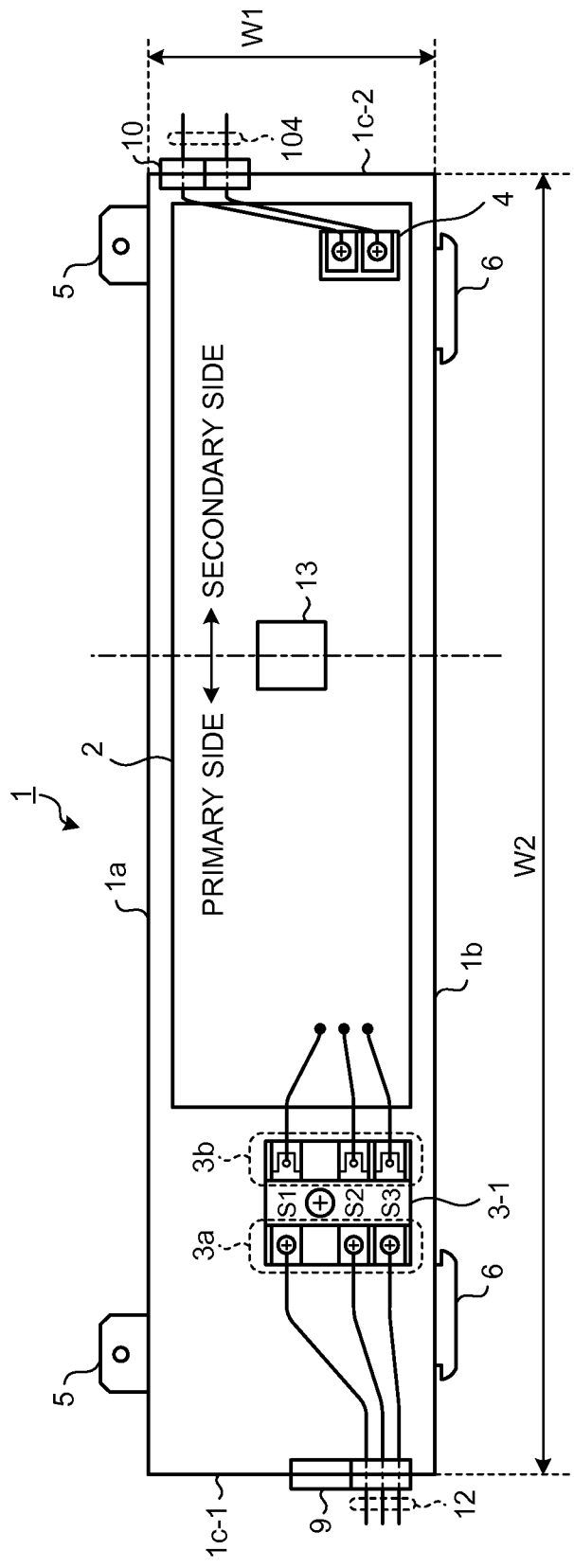
FIG. 3 is an interior perspective view of an electric component box according to the first embodiment of the present invention.

FIG. 3 is an interior perspective view of the electric component box 1 according to the first embodiment of the present invention. FIG. 3 illustrates an example of components provided in the electric component box 1. In the electric component box 1, the following are provided: a control board 2 on which a drive circuit that drives a blower electric motor mounted on the indoor unit 102 is implemented; a power supply and indoor-outdoor wiring terminal block 3-1; and a communication-wire terminal block 4. A fitting terminal 5 and a lock member 6 for fixing a lid (not illustrated) that blocks an opening surface (a surface opposing to the decorative panel 102b) of the electric component box 1 are formed on the casing of the electric component box 1.

The power supply and indoor-outdoor wiring terminal block 3-1 is screwed to the casing of the electric component box 1 between one short side surface 1c-1 of the casing of the electric component box 1 and the control board 2. A primary side terminal 3a of the power supply and indoor-outdoor wiring terminal block 3-1 is, for example, connected to a power-supply wiring line 12 (for example, single-phase three-wire 200 V wiring) drawn to through a wiring port 9 formed on the short side surface 1c-1 of the electric component box 1. Wiring to the control board 2 is connected to a secondary side terminal 3b of the power supply and indoor-outdoor wiring terminal block 3-1; and, the indoor-outdoor communication wire 103 is connected to, for example, an S1 terminal to which a grounding wire of the power-supply wiring line 12 is connected and an S2 terminal to which one of the power wires of the power-supply wiring line 12 is connected (or an S3 terminal to which the other of the power wires of the power-supply wiring line 12 is connected). Accordingly, the outdoor unit 101 and the indoor unit 102 are connected via power line carrier system.

The wiring connected to the secondary side terminal 3b is electrically connected to a primary-side winding wire (not illustrated) of a power supply transformer 13 provided on the control board 2. A secondary-side winding wire (not illustrated) of the power supply transformer 13 is electrically connected to a converter circuit (not illustrated) mounted on the control board 2. In FIG. 3, an area more on the primary winding side of the control board 2 than the power supply transformer 13 is expressed as "primary side"; and an area more on the secondary winding side of the control board 2 than the power supply transformer 13 is expressed as "secondary side".

The communication-wire terminal block 4 is provided in the area on the secondary winding side of the control board 2, away from the power supply transformer 13, and near the other short side surface 1c-2 of the electric component box 1. For example, the remote-controller communication wire 104 drawn in through a wiring port 10 formed on the short side surface 1c-2 is connected to the communication-wire terminal block 4.

The operation of the air conditioner is explained below. Commercial power supplied through the power-supply wiring line 12 is converted to DC power by a converter circuit (not illustrated) mounted on the control board 2; and the converted DC power is converted to AC power with a desired frequency by an inverter circuit (not illustrated) and is supplied to the electric motor in the indoor unit 102. Indoor air is drawn in through the suction port 102c in the decorative panel 102b by the rotating blower connected to the shaft of the electric motor. At this time, indoor air having passed through the suction port 102c is introduced into the bell mouth 102e without being blocked by the inner side surface 1b of the electric component box 1; and air with which heat has been exchanged by the heat exchanger in the indoor unit 102 is blown out into a room through the outlet ports 102d.

Figure 4:
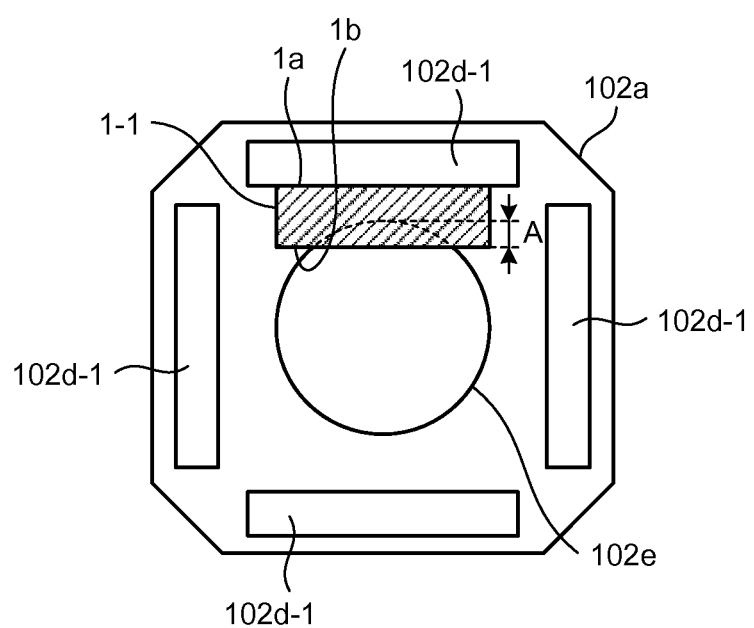
FIG. 4 illustrates an indoor unit using a conventional electric component box and is as viewed from a lower surface side.
Figure 5:
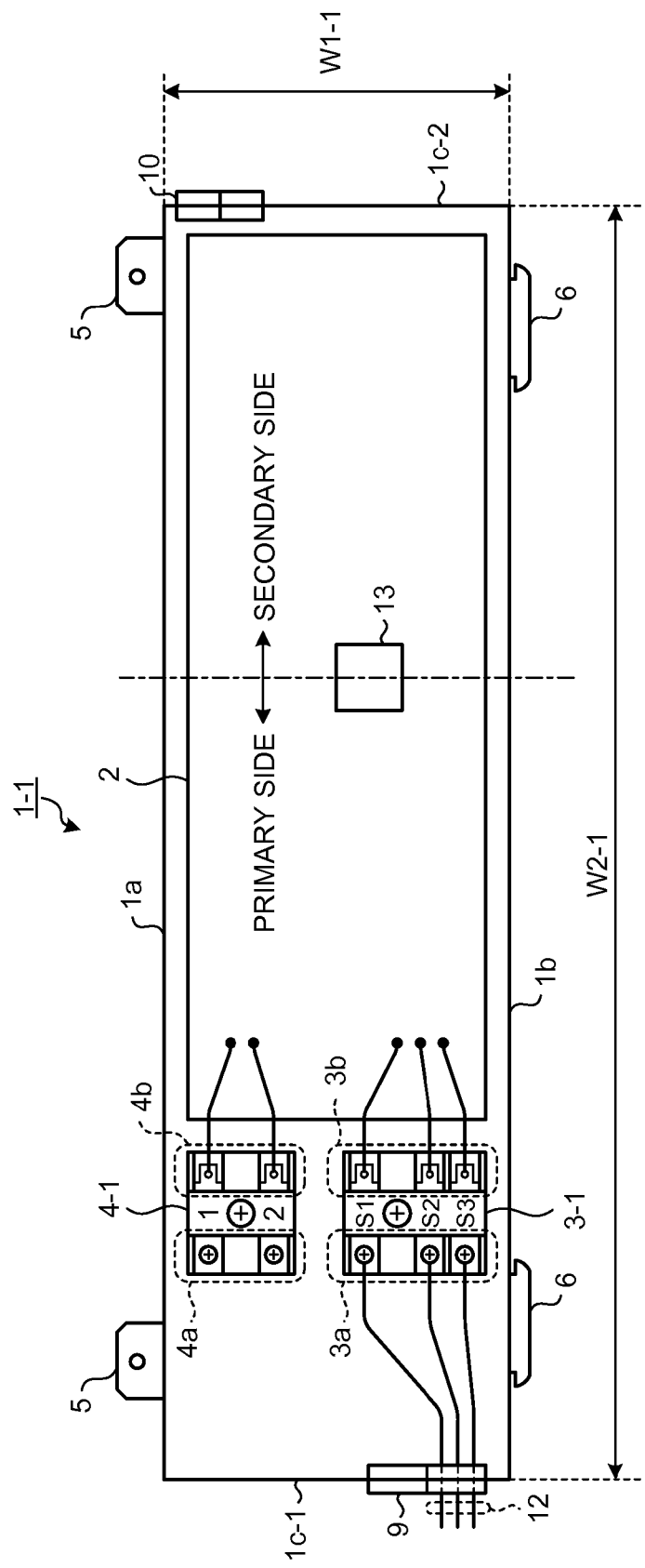
FIG. 5 is an interior perspective view of an electric component box illustrated in FIG. 4.

FIG. 4 illustrates the indoor unit using a conventional electric component box 1-1, as viewed from a lower surface side. FIG. 5 is an interior perspective view of the electric component box 1-1 illustrated in FIG. 4. The difference between the electric component box 1 in FIG. 3 and the electric component box 1-1 in FIG. 5 lies in the fact that in the electric component box 1-1, a communication-wire terminal block 4-1 is arranged near the power supply and indoor-outdoor wiring terminal block 3-1 and is screwed to the casing of the electric component box 1-1. The remote-controller communication wire 104 is connected to a primary side terminal 4*a* of the communication-wire terminal block 4-1; and the wiring to the control board 2 is connected to a secondary side terminal 4*b*.

In the electric component box 1-1 formed in this manner, because the wiring between the communication-wire terminal block 4-1 and the control board 2 is required, the material cost and man-hours for assembly associated with the wiring increase. The installing of the communication-wire terminal block 4-1 of such a size inside the electric component box 1-1 requires much space. Further, the communication-wire terminal block 4-1 is provided near the power supply and indoor-outdoor wiring terminal block 3-1; therefore, noise from the power supply is induced in the wiring of the secondary side terminal 4*b*, thereby causing erroneous operations of the devices. In contrast, in the electric component box 1 according to the first embodiment, the communication-wire terminal block 4 is provided on the control board 2 so that wiring to the control board 2 can be eliminated; the material costs and man-hours for assembly associated with the wiring can be reduced; and the space described above can be reduced as well. Furthermore, the communication-wire terminal block 4 is provided in the area on the secondary winding side of the control board 2 away from the power supply transformer 13; therefore, it is difficult to induce noise from the power supply in the communication-wire terminal block 4, thus reducing the erroneous operations of the device.

Note that in the conventional electric component box 1-1, because the communication-wire terminal block 4-1 is screwed to the casing of the electric component box 1-1 between the outer side surface 1*a* and the power supply and the indoor-outdoor wiring terminal block 3-1, the short side dimension of the electric component box 1-1 becomes relatively large. For example, given that the short side dimension and the long side dimension of the electric component box 1 in FIG. 3 are respectively W1 and W2; and the short side dimension and the long side dimension of the electric component box 1-1 in FIG. 5 are respectively W1-1 and W2-1, then W2-1 is equal to W2, but W1-1 is larger than W1. FIG. 4 illustrates what the conventional electric component box 1-1 is provided in the casing 102*a*, where the outer side surface 1*a* of the electric component box 1-1 is positioned more on the outer diameter side than on an edge of an outlet port 102*d*-1; however, the inner side surface 1*b* of the electric component box 1-1 is positioned more on an inner diameter side than on an edge of the opening of the bell mouth 102*e*. In this manner, because the inner side surface 1*b* of the electric component box 1-1 overhangs toward the inner diameter side from the edge of the opening of the bell mouth 102*e*, a portion of indoor air having passed through the suction port 102*c* of the decorative panel 102*b* is blocked by the electric component box 1-1, and the amount of air circulating through the heat exchanger in the indoor unit 102 relatively decreases and the heat-exchange efficiency also decreases.

Figure 6:
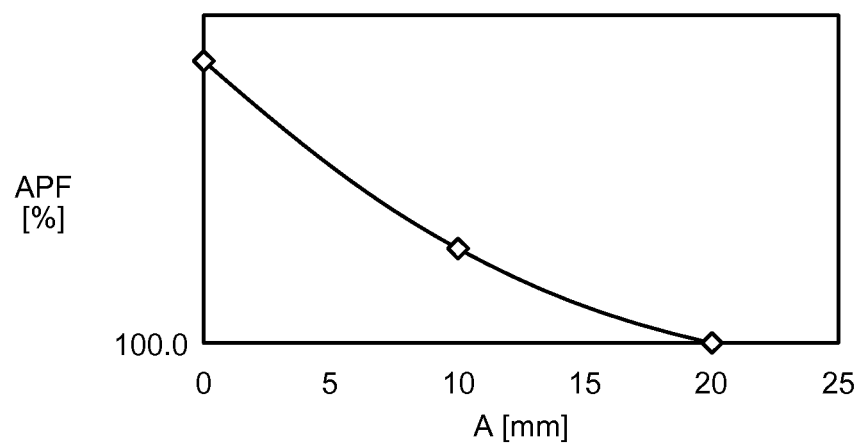
FIG. 6 illustrates a relation between the dimension A illustrated in FIG. 4 and an annual performance factor (APF) for power consumption of the air conditioner.

FIG. 6 illustrates a relation between the dimension A illustrated in FIG. 4 and an annual performance factor (APF) for power consumption of the air conditioner. The graph in FIG. 6 illustrates the APF value when the overhanging amount of the inner side surfaces 1*b* of the electric component box 1 and the electric component box 1-1 toward the inner diameter side from the edge of the opening of the bell mouth 102*e* is changed. The horizontal axis denotes the distance from the inner side surfaces 1*b* of the electric component box 1 and the electric component box 1-1 to the edge of the opening of the bell mouth 102*e* (the dimension A in FIG. 4), and the vertical axis denotes the APF. In the graph illustrated in FIG. 6, the APF is given 100% when the dimension A is 20 millimeters, and it is understood that the APF is improved as the dimension A decreases from 20 millimeters. That is, by providing the communication-wire terminal block 4 on the control board 2, the short side dimension W1 of the electric component box 1 becomes smaller than the short side dimension W1-1 of the conventional electric component box 1-1, and the inner side surface 1*b* of the electric component box 1 does not overhang toward the inner diameter side from the edge of the opening of the bell mouth 102*e*, thereby improving the APF value.

Figure 7:
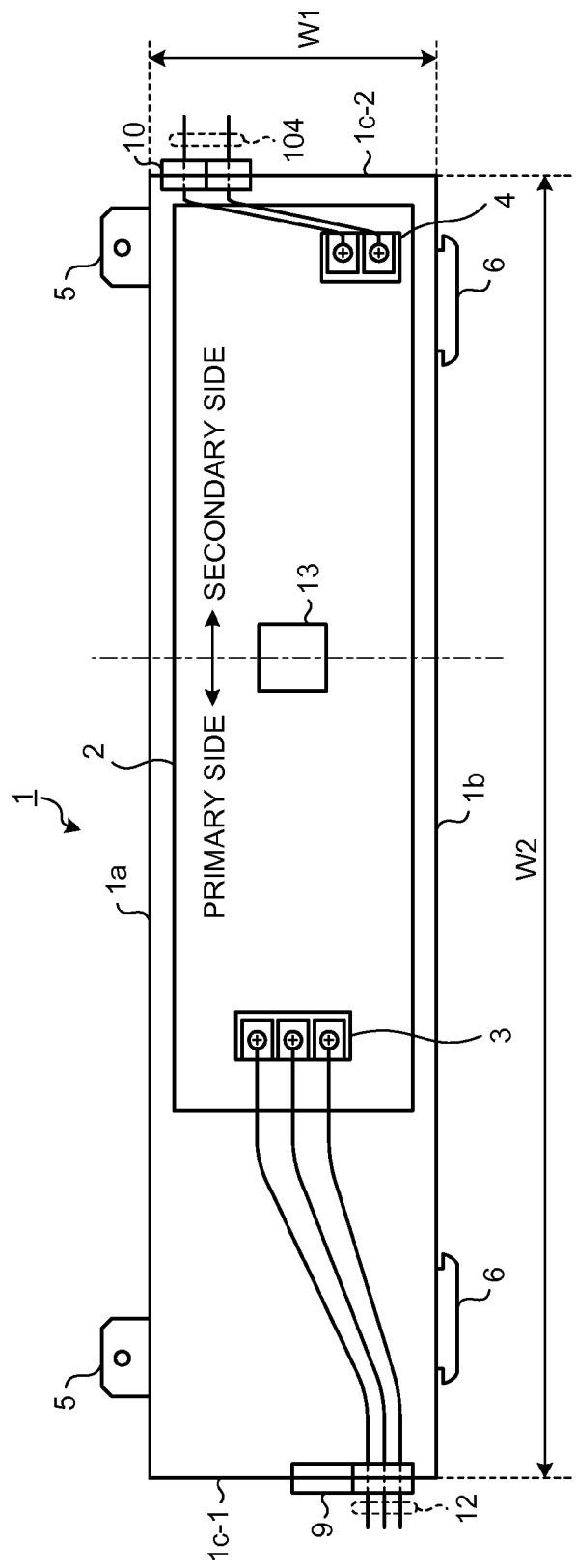
FIG. 7 is an explanatory diagram of a modification of the electric component box according to the first embodiment of the present invention.

FIG. 7 is an explanatory diagram of a modification of the electric component box 1 according to the first embodiment of the present invention. In the electric component box 1 in FIG. 7, the power supply and indoor-outdoor wiring terminal block 3 is provided on the control board 2. According to this configuration, wiring from the power supply and indoor-outdoor wiring terminal block 3 to the control board 2 can be reduced, and the wiring cost thereof can be reduced.

The embodiment has been described as an example in which the four-directional cassette-type indoor unit is used as the indoor unit of the air conditioner. However, the electric component box 1 is applicable to indoor units other than the four-directional cassette-type indoor unit and is also applicable to devices other than the indoor unit of the air conditioner (devices including at least the control board 2 and the communication-wire terminal block 4). In this application, effects (particularly, the reduction of cost and space by reducing the wiring to the control board 2) described above can also be achieved.

As described above, the electric component box 1 according to the first embodiment includes the following: the control board 2 on which a circuit component (an inverter circuit or the like) that controls the driving of a load; the power supply transformer 13 provided on the control board 2 in which the primary-side winding wire is connected to the power wire (the power-supply wiring line 12 or the like) that supplies power to the load and in which the secondary winding side is connected to the circuit component; and the communication-wire terminal block 4 provided in the area toward the secondary winding side of the control board 2 away from the power supply transformer 13, and connected to the communication wire (the remote-controller communication wire 104) from a remote control device (the remote controller 105). Due to this configuration, the wiring to the control board 2 can be eliminated; the material cost and man-hours for assembly associated with the wiring can be reduced; and the space in which the communication-wire terminal block 4 is provided can be reduced. Furthermore, noise from the power supply is not induced in the communication-wire terminal block 4; therefore, erroneous operations of the device can be reduced. Further, because the short side dimension of the casing of the electric component box 1 becomes smaller compared with that of the conventional electric component box 1-1, indoor air having passed through the suction port 102*c* of the decorative panel 102*b* is not blocked by the electric component box 1, thereby enabling the heat exchange efficiency to be improved.

Second Embodiment

Figure 8:
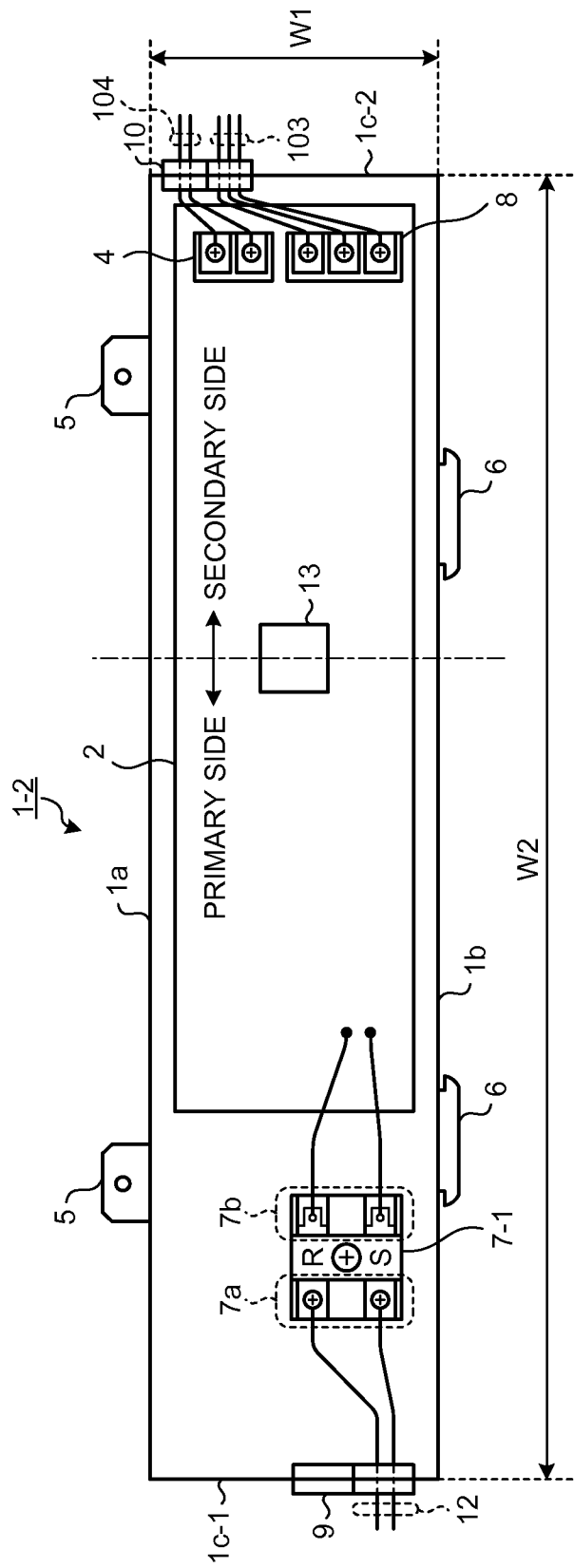
FIG. 8 is an interior perspective view of an electric component box according to the second embodiment of the present invention.

FIG. 8 is an interior perspective view of an electric component box 1-2 according to the second embodiment of the present invention. The differences from the first embodiment lie in the fact that a power-wire terminal block 7-1 and an indoor-outdoor wiring terminal block 8 are used instead of the power supply and indoor-outdoor wiring terminal block 3; and that the indoor-outdoor wiring terminal block 8 is provided on the control board 2. In the following descriptions, elements identical to those of the first embodiment are denoted by like reference signs and explanations thereof will be omitted; and elements different from those of the first embodiment are explained.

The power-wire terminal block 7-1 is screwed to the casing of the electric component box 1-2 between the control board 2 and the short side surface 1c-1 of the electric component box 1-2. For example, the power-supply wiring line 12 (for example, single phase 200 V wiring), which is drawn in from the wiring port 9 formed on the short side surface 1c-1 of the electric component box 1-2, is connected to a primary side terminal 7a of the power-wire terminal block 7-1. Wiring to the control board 2 is connected to a secondary side terminal 7b of the power-wire terminal block 7-1. The wiring connected to the secondary side terminal 7b of the power-wire terminal block 7-1 is electrically connected to a primary-side winding wire (not illustrated) of the power supply transformer 13 provided on the control board 2.

The indoor-outdoor wiring terminal block 8 is provided on the area toward the secondary winding side of the control board 2 away from the power supply transformer 13 and is provided near the short side surface 1c-2 of the electric component box 1-2. The indoor-outdoor communication wire 103 drawn in from the wiring port 10 formed on the short side surface 1c-2 of the electric component box 1-2 is connected to the indoor-outdoor wiring terminal block 8, for example. In the example illustrated in FIG. 8, the communication-wire terminal block 4 is provided in an area on the side near to the outer side surface 1a of the control board 2 and away from the side of the indoor-outdoor wiring terminal block 8. However, the positions of the indoor-outdoor wiring terminal block 8 and the communication-wire terminal block 4 are not limited to the example illustrated in FIG. 8.

Figure 9:
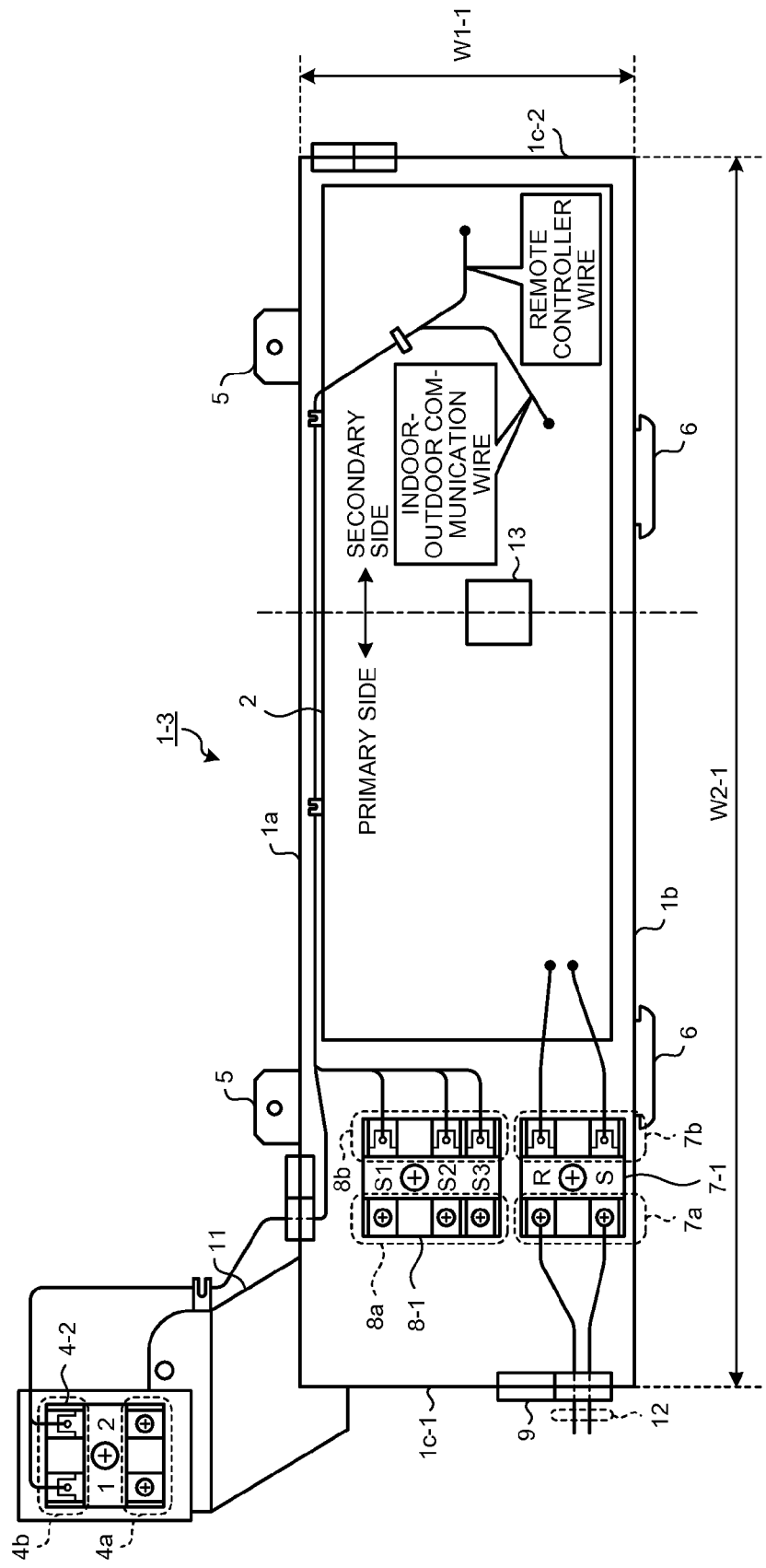
FIG. 9 is a configuration diagram of a conventional electric component box in which a power-wire terminal block, an indoor-outdoor wiring terminal block, and a communication-wire terminal block are provided.
Figure 10:
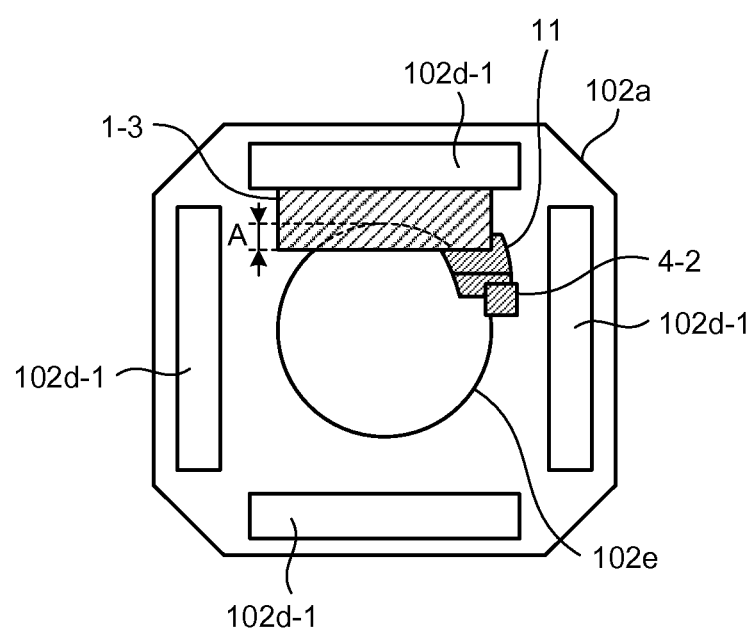
FIG. 10 is a diagram of an indoor unit using an electric component box illustrated in FIG. 9 and is as viewed from a lower surface side.

FIG. 9 is a configuration diagram of a conventional electric component box 1-3 in which a power-wire terminal block 7-1, an indoor-outdoor wiring terminal block 8-1, and a communication-wire terminal block 4-2 are provided. FIG. 10 is a diagram of an indoor unit using the electric component box 1-3 illustrated in FIG. 9 and is as viewed from a lower surface side. The differences between the electric component box 1-2 in FIG. 8 and the electric component box 1-3 in FIG. 9 lie in the fact that in the electric component box 1-3, the indoor-outdoor wiring terminal block 8-1 is arranged near the power-wire terminal block 7-1 and is screwed to the casing of the electric component box 1-3, and the communication-wire terminal block 4-2 is screwed to a support member 11 attached to the outer side surface 1a of the electric component box 1-3. The indoor-outdoor communication wire 103 (see FIG. 1) is connected to a primary side terminal 8a of the indoor-outdoor wiring terminal block 8-1, and wiring to the control board 2 is connected to a secondary side terminal 8b of the indoor-outdoor wiring terminal block 8-1. Furthermore, the remote-controller communication wire 104 (see FIG. 1) is connected to the primary side terminal 4a of the communication-wire terminal block 4-2, and the wiring to the control board 2 is connected to the secondary side terminal 4b of the communication-wire terminal block 4-2.

In the electric component box 1-3 thus constituted, not only the wiring between the indoor-outdoor wiring terminal block 8-1 and the control board 2 but also the wiring between the communication-wire terminal block 4-2 and the control board 2 are required, which increase the material cost and man-hours for assembly associated with the wiring. A large space is also required inside the electric component box 1-3 for installing the indoor-outdoor wiring terminal block 8-1 and the communication-wire terminal block 4-2. Furthermore, because the indoor-outdoor wiring terminal block 8-1 is provided near to the power-wire terminal block 7-1, noise due to the power supply is induced in the wiring connected to the secondary side terminal 8b and the wiring connected to the secondary side terminal 2b, thereby causing erroneous operations of the device. Further, in the electric component box 1-3, because the indoor-outdoor wiring terminal block 8-1 is screwed to the casing of the electric component box 1-3 between the outer side surface 1a of the electric component box 1-3 and the power-wire terminal block 7-1, the short side dimension of the electric component box 1-3 becomes relatively large. Note that there is no space for installing the communication-wire terminal block 4-2 inside the casing of the electric component box 1-3, as illustrated in the example illustrated in FIG. 9, therefore the communication-wire terminal block 4-2 needs to be fitted to the support member 11 provided outside of the casing of the electric component box 1-3.

Furthermore, in the electric component box 1-2 according to the second embodiment, because the communication-wire terminal block 4 and the indoor-outdoor wiring terminal block 8 are provided on the control board 2, the wiring to the control board 2 can be omitted, and the material cost and man-hours for assembly associated with the wiring can be reduced, and the space described above can be reduced as well. Furthermore, because the communication-wire terminal block 4 and the indoor-outdoor wiring terminal block 8 are provided in the area toward the secondary winding side of the control board 2 away from the power supply transformer 13, noise from the power supply is hard to be induced in the communication-wire terminal block 4 and the indoor-outdoor wiring terminal block 8, and therefore, erroneous operations of the device can be reduced. Further, because the communication-wire terminal block 4 and the indoor-outdoor wiring terminal block 8 are provided on the control board 2, the short side dimension W1 of the electric component box 1-2 is smaller than the short side dimension W1-1 of the conventional electric component box 1-3, and the inner side surface 1b of the electric component box 1-2 does not overhang toward the inner diameter side more than the edge of the opening of the bell mouth 102e, which thereby improves the APF value described as in the first embodiment.

FIG. 11 is an explanatory diagram of a modification of the electric component box 1-2 according to the second embodiment of the present invention. In the electric component box 1-2 in FIG. 11, the power-wire terminal block 7 is provided on the control board 2. Due to this configuration, wiring from the power-wire terminal block 7 to the control board 2 can be omitted.

Third Embodiment

FIGS. 12A to 12C are interior perspective views of an electric component box 1-4 according to a third embodiment of the present invention. The difference from the first embodiment lies in the fact that the communication-wire terminal blocks 4 and 4-1 and the power supply and indoor-outdoor wiring terminal blocks 3 and 3-1 are respectively arranged the other way around horizontally. In the following descriptions, elements identical to those of the first embodiment are denoted by similar reference signs and explanations thereof will be omitted, and elements different from those of the first embodiment are explained.

In the electric component box 1-4 illustrated in FIG. 12A, the power supply and indoor-outdoor wiring terminal block 3 is provided in the area more on the primary winding side of the control board 2 than the power supply transformer 13, and provided near to the short side surface 1c-2; and the communication-wire terminal block 4-1 is screwed to the casing of the electric component box 1-4 on the secondary side of the power supply transformer 13. That is, the electric component box 1-4 illustrated in FIG. 12A includes the control board 2 that controls the air conditioner indoor unit; the power supply and indoor-outdoor wiring terminal block 3 provided on the control board and connected to a communication wire (the indoor-outdoor communication wire 103) that is wired from the indoor unit to the outdoor unit of the air conditioner and a power wire (the power-supply wiring line 12) that supplies power; and the communication-wire terminal block 4-1 connected to a communication wire for an external input (the remote-controller communication wire 104). Due to this configuration, wiring from the power supply and indoor-outdoor wiring terminal block 3 to the control board 2 can be omitted, and the material cost and man-hours for assembly associated with the wiring can be reduced. The space for installing the power supply and indoor-outdoor wiring terminal block 3 to the casing by screwing is not required. Furthermore, noise from the power supply is not induced in the communication-wire terminal block 4-1, and erroneous operations of the device can be reduced. Further, the power supply and indoor-outdoor wiring terminal block 3 is provided on the control board 2; therefore the short side dimension W1 (see FIG. 3) of the electric component box 1-4 is made shorter, and the APF value is improved similarly to the first embodiment.

In the electric component box 1-4 illustrated in FIG. 12B, the communication-wire terminal block 4 is provided in the area more on the secondary winding side of the control board 2 than the power supply transformer 13, and is provided near to the short side surface 1c-1; and the power supply and indoor-outdoor wiring terminal block 3-1 is screwed to the casing of the electric component box 1-4 on the primary side of the power supply transformer 13. That is, the electric component box 1-4 illustrated in FIG. 12B includes the control board 2, the power supply and indoor-outdoor wiring terminal block 3-1, and the communication-wire terminal block 4 provided on the control board 2. Due to this configuration, wiring from the communication-wire terminal block 4 to the control board 2 can be omitted, and the material cost and man-hours for assembly associated with the wiring can be reduced. The space in which the communication-wire terminal block 4 is provided to the casing by screwing is not required. Furthermore, noise from the power supply is not induced in the communication-wire terminal block 4, and erroneous operations of the device can be reduced. Further, the communication-wire terminal block 4 is provided on the control board 2; therefore, the short side dimension W1 of the electric component box 1-4 is made shorter and the APF value is improved similarly to the first embodiment.

In the electric component box 1-4 illustrated in FIG. 12C, the communication-wire terminal block 4 is provided in the area more on the secondary winding side of the control board 2 than the power supply transformer 13, and provided near to the short side surface 1c-1. Furthermore, the power supply and indoor-outdoor wiring terminal block 3 is provided in the area more on the primary winding side of the control board 2 than the power supply transformer 13. That is, the electric component box 1-4 illustrated in FIG. 12C includes the control board 2, the power supply and indoor-outdoor wiring terminal block 3 provided on the control board 2, and the communication-wire terminal block 4 provided on the control board 2. Due to this configuration, the material cost and man-hours for assembly associated with the wiring can be further reduced compared with the configuration examples illustrated in FIGS. 12A and 12B. Further, the space for installing these terminal blocks is not required; therefore, the electric component box 1-4 can be further downsized.

In each of the respective electric component boxes 1-4 illustrated in FIGS. 12A to 12C, the power supply and indoor-outdoor wiring terminal blocks 3 and 3-1 are provided more on the primary side of the power supply transformer 13; the communication-wire terminal blocks 4 and 4-1 are provided more on the secondary side of the power supply transformer 13; and the power wire (the power-supply wiring line 12) is wired to the primary side of the power supply transformer 13, without contacting with the communication wire that is wired to the secondary side of the power supply transformer 13 (the indoor-outdoor communication wire 103 and the remote-controller communication wire 104). Due to this configuration, noise from the power supply is not induced in the communication wire, and erroneous operations of the device can be reduced.

Fourth Embodiment

Figure 13A:
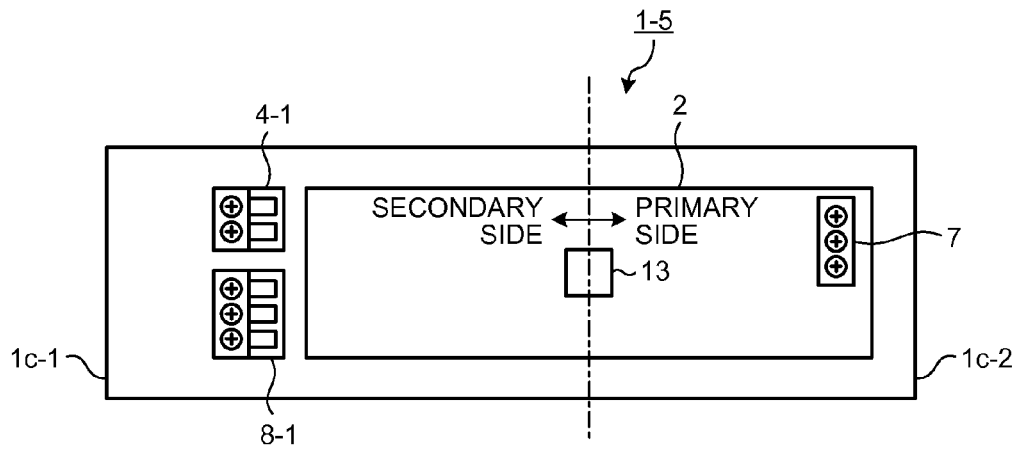
FIGS. 13A to 13C are interior perspective views of an electric component box according to a fourth embodiment of the present invention.
Figure 13B:
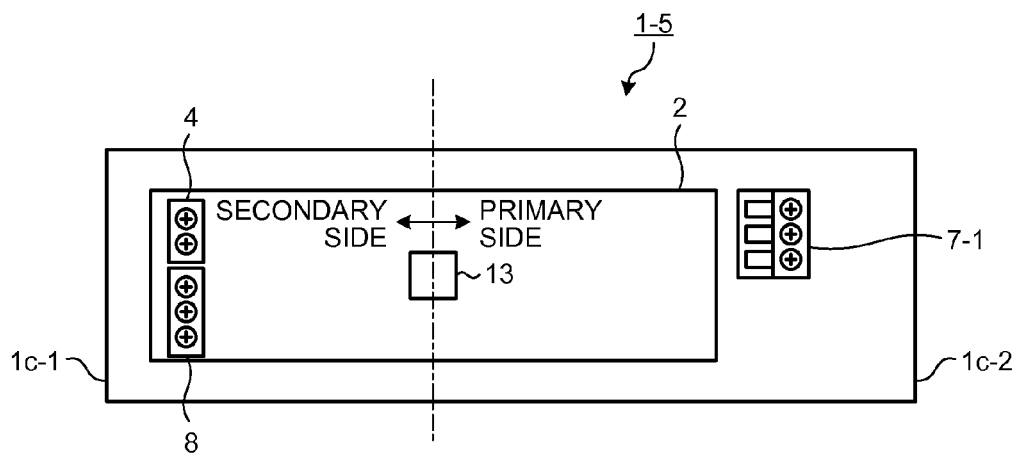
Figure 13C:
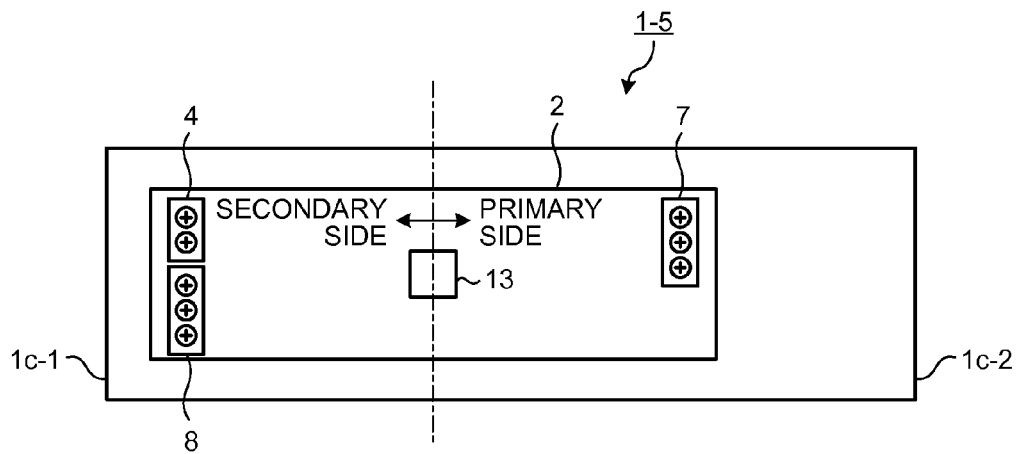

FIGS. 13A to 13C are interior perspective views of an electric component box 1-5 according to a fourth embodiment of the present invention. The differences from the second embodiment lie in the fact that the communication-wire terminal blocks 4, 4-1, the indoor-outdoor wiring terminal blocks 8, 8-1, and the power-wire terminal blocks 7, 7-1 are arranged the other way around horizontally. In the following descriptions, elements identical to those of the second embodiment are denoted by like reference signs and explanations thereof will be omitted, and elements different from those of the first embodiment are explained.

In the electric component box 1-5 illustrated in FIG. 13A, the power-wire terminal block 7 is provided in the area more on the primary winding side of the control board 2 than the power supply transformer 13, and is provided near to the short side surface 1c-2; and the communication-wire terminal block 4-1 and the indoor-outdoor wiring terminal block 8-1 are screwed to the casing of the electric component box 1-5 on the secondary side of the power supply transformer 13. That is, the electric component box 1-5 illustrated in FIG. 13A includes the control board 2, the indoor-outdoor wiring terminal block 8-1, the communication-wire terminal block 4-1, and the power-wire terminal block 7 provided on the control board 2. Due to this configuration, wiring from the power-wire terminal block 7 to the control board 2 can be omitted, and the material cost and man-hours for assembly associated with the wiring can be reduced. The space for installing the power-wire terminal block 7 to the casing by screwing is not required. Furthermore, noise from the power supply is not induced in the communication-wire terminal block 4-1 and the indoor-outdoor wiring terminal block 8-1, and thus erroneous operations of the device can be reduced. Further, the power-wire terminal block 7 is provided on the control board 2; therefore, the short side dimension W1 (see FIG. 8) of the electric component box 1-5 becomes shorter and the APF value is improved similarly to the second embodiment.

In the electric component box 1-5 illustrated in FIG. 13B, the communication-wire terminal block 4 and the indoor-outdoor wiring terminal block 8 are provided in the area more on the secondary winding side of the control board 2 than the power supply transformer 13, and provided near to the short side surface 1c-1; and the power-wire terminal block 7-1 is screwed to the casing of the electric component box 1-5 on the primary side of the power supply transformer 13. That is, the electric component box 1-5 illustrated in FIG. 13B includes the control board 2, the indoor-outdoor wiring terminal block 8 provided on the control board 2, the communication-wire terminal block 4 provided on the control board 2, and the power-wire terminal block 7-1. Due to this configuration, wiring from the communication-wire terminal block 4 and the indoor-outdoor wiring terminal block 8 to the control board 2 can be omitted, and the material cost and man-hours for assembly associated with the wiring can be reduced. The space for installing the communication-wire terminal block 4 and the indoor-outdoor wiring terminal block 8 to the casing by screwing is not required. Furthermore, noise from the power supply is not induced in the communication-wire terminal block 4 and the indoor-outdoor wiring terminal block 8, and erroneous operations of the device can be reduced. Further, because the communication-wire terminal block 4 and the indoor-outdoor wiring terminal block 8 are provided on the control board 2, the short side dimension W1 of the electric component box 1-5 becomes shorter and the APF value is improved similarly to the second embodiment.

In the electric component box 1-5 illustrated in FIG. 13C, the communication-wire terminal block 4 and the indoor-outdoor wiring terminal block 8 are provided in the area more on the secondary winding side of the control board 2 than the power supply transformer 13, and are provided near to the short side surface 1c-1. Furthermore, the power-wire terminal block 7 is provided in the area more on the primary winding side of the control board 2 than the power supply transformer 13. That is, the electric component box 1-5 illustrated in FIG. 13C includes the control board 2, the indoor-outdoor wiring terminal block 8 provided on the control board 2, the communication-wire terminal block 4 provided on the control board 2, and the power-wire terminal block 7 provided on the control board 2. Due to this configuration, the material cost and man-hours for assembly associated with the wiring can be further reduced than the configuration examples illustrated in FIGS. 13A and 13B. Further, because the space for installing these terminal blocks is not required, the electric component box 1-5 can be more downsized.

In the respective electric component boxes 1-5 illustrated in FIGS. 13A to 13C, the power-wire terminal blocks 7, 7-1 are provided on the primary side of the power supply transformer 13; and the communication-wire terminal blocks 4 and 4-1 and the indoor-outdoor wiring terminal blocks 8, 8-1 are provided on the secondary side of the power supply transformer 13. The power wire is wired to the primary side of the power supply transformer 13, without connecting to the communication wire that is wired to the secondary side of the power supply transformer 13. Due to this configuration, noise from the power supply is not induced in the communication wire, and erroneous operations of the device can be reduced.

The above embodiments of the present invention are only an example of the contents of the present invention, and it is possible to combine the embodiments with other publicly-known techniques, and it is needless to mention that the present invention can be configured while modifying it without departing from the scope of the invention, such as omitting a part of configurations in the embodiments.

According to the present invention, further cost reduction and space reduction can be achieved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electric component box that accommodates therein an electric component, the electric component box comprising:
   a casing;
   a control board that is provided on the casing and that controls an air conditioner indoor unit;
   a power supply transformer that is provided on the control board;
   a primary side of the power supply transformer including an area extending in a first direction along the control board from one side of the power supply transformer;
   a secondary side of the power supply transformer including an area extending in an opposite direction to the first direction along the control board from another side of the power supply transformer;
   a power supply and indoor-outdoor wiring terminal block that is provided on the primary side of the power supply transformer and on the control board, where the power supply and indoor-outdoor wiring terminal block is connected to each of
      a communication wire wired from the air conditioner indoor unit to an air conditioner outdoor unit and
      a power wire that supplies power; and
   a communication-wire terminal block that is provided on the secondary side of the power supply transformer, where the communication-wire terminal block is connected to an external input communication wire for an external input.

2. The electric component box according to claim 1, wherein
   the power wire is wired to the primary side of the power supply transformer without contacting with the communication wire that is wired to the secondary side of the power supply transformer.

3. An indoor unit of an air conditioner comprising the electric component box according to claim 1.

4. An indoor unit of an air conditioner comprising the electric component box according to claim 1, wherein
   the electric component box is provided between an edge of an opening of a bell mouth that is formed in the indoor unit of a ceiling cassette type and an air outlet port formed in the indoor unit.

5. An electric component box that accommodates therein an electric component, the electric component box comprising:
   a casing;
   a control board that is provided on the casing and that controls an air conditioner indoor unit;
   a power supply transformer that is provided on the control board;
   a primary side of the power supply transformer including an area extending in a first direction along the control board from one side of the power supply transformer;

a secondary side of the power supply transformer including an area extending in an opposite direction to the first direction along the control board from another side of the power supply transformer;

a power supply and indoor-outdoor wiring terminal block that is provided on a primary side of the power supply transformer and that is connected to each of
- a communication wire wired from the air conditioner indoor unit to an air conditioner outdoor unit and
- a power wire that supplies power; and a communication-wire terminal block that is provided on a secondary side of the power transformer and on the control board and that is connected to an external input communication wire for an external input.

6. The electric component box according to claim 5, wherein
the power wire is wired to the primary side of the power supply transformer without contacting with the communication wire that is wired to the secondary side of the power supply transformer.

7. An indoor unit of an air conditioner comprising the electric component box according to claim 5.

8. An indoor unit of an air conditioner comprising the electric component box according to claim 5, wherein
the electric component box is provided between an edge of an opening of a bell mouth that is formed in the indoor unit of a ceiling cassette type and an air outlet port formed in the indoor unit.

9. An electric component box that accommodates therein an electric component, the electric component box comprising:
a casing;
a control board that is provided on the casing and that controls an air conditioner indoor unit;
a power supply transformer that is provided on the control board;
a primary side of the power supply transformer including an area extending in a first direction along the control board from one side of the power supply transformer;
a secondary side of the power supply transformer including an area extending in an opposite direction to the first direction along the control board from another side of the power supply transformer;
an indoor-outdoor wiring terminal block that is provided on a secondary side of the power supply transformer and that is connected to a communication wire wired from the air conditioner indoor unit to an air conditioner outdoor unit;
a communication-wire terminal block that is provided on the secondary side of the power supply transformer and connected to an external input communication wire for an external input; and
a power-wire terminal block that is provided on the primary side of the power supply transformer and on the control board and that is connected to a power wire that supplies power.

10. The electric component box according to claim 9, wherein
the power wire is wired to the primary side of the power supply transformer without contacting with the communication wire that is wired to the secondary side of the power supply transformer.

11. An indoor unit of an air conditioner comprising the electric component box according to claim 9.

12. An indoor unit of an air conditioner comprising the electric component box according to claim 9, wherein
the electric component box is provided between an edge of an opening of a bell mouth that is formed in the indoor unit of a ceiling cassette type and an air outlet port formed in the indoor unit.

13. An electric component box that accommodates therein an electric component, the electric component box comprising:
a casing;
a control board that is provided on the casing and that controls an air conditioner indoor unit;
a power supply transformer that is provided on the control board;
a primary side of the power supply transformer including an area extending in a first direction along the control board from one side of the power supply transformer;
a secondary side of the power supply transformer including an area extending in an opposite direction to the first direction along the control board from another side of the power supply transformer;
an indoor-outdoor wiring terminal block that is provided on the secondary side of the power supply transformer and on the control board, where the indoor-outdoor wiring terminal block is connected to a communication wire that is wired from the air conditioner indoor unit to an air conditioner outdoor unit;
a communication-wire terminal block that is provided on the secondary side of the power supply transformer and on the control board and is connected to an external input communication wire for an external input; and
a power-wire terminal block that is provided on the primary side of the power source transformer and that is connected to a power wire that supplies power.

14. The electric component box according to claim 13, wherein
the power wire is wired to the primary side of the power supply transformer without contacting with the communication wire that is wired to the secondary side of the power supply transformer.

15. An indoor unit of an air conditioner comprising the electric component box according to claim 13.

16. An indoor unit of an air conditioner comprising the electric component box according to claim 13, wherein
the electric component box is provided between an edge of an opening of a bell mouth that is formed in the indoor unit of a ceiling cassette type and an air outlet port formed in the indoor unit.

* * * * *